United States Patent
Egitto et al.

(10) Patent No.: US 6,822,332 B2
(45) Date of Patent: Nov. 23, 2004

(54) FINE LINE CIRCUITIZATION

(75) Inventors: Frank D. Egitto, Binghamton, NY (US); Kevin T. Knadle, Endicott, NY (US); Andrew M. Seman, Kirkwood, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 10/253,439

(22) Filed: Sep. 23, 2002

(65) Prior Publication Data

US 2004/0056330 A1 Mar. 25, 2004

(51) Int. Cl.[7] .................. H01L 23/48; H01L 23/52; H01L 29/40
(52) U.S. Cl. .................. 257/773; 438/597; 148/33.2
(58) Field of Search .................. 257/24, 410, 411, 257/412, 773, 774, 775, 786, 192, 793, 618, 622, 623, 624, 627, 628; 438/597, 598, 599, 902

(56) References Cited

U.S. PATENT DOCUMENTS

| | | |
|---|---|---|
| 3,867,217 A | 2/1975 | Maggs et al. .................. 156/3 |
| 4,155,783 A * | 5/1979 | Feist .................. 148/33.2 |
| 4,780,177 A | 10/1988 | Wojnarowski et al. ...... 156/643 |
| 4,783,421 A | 11/1988 | Carlson et al. .................. 437/4 |
| 4,877,481 A | 10/1989 | Fukuda et al. .............. 156/643 |
| 5,104,480 A | 4/1992 | Wojnarowski et al. ...... 156/643 |
| 5,666,722 A | 9/1997 | Tamm et al. .................. 29/847 |
| 6,004,619 A | 12/1999 | Dippon et al. ................ 427/97 |
| 6,035,527 A | 3/2000 | Tamm .......................... 29/852 |
| 6,107,119 A | 8/2000 | Farnworth et al. .......... 438/106 |

FOREIGN PATENT DOCUMENTS

| | | |
|---|---|---|
| EP | 0480703 A2 | 4/1992 |
| JP | 5291730 A | 11/1993 |
| JP | 9116255 A | 5/1997 |
| JP | 9246688 A | 9/1997 |

OTHER PUBLICATIONS

IBM TDB, vol. 29, No. 9, Feb. 1987, "PC Board Construction Method".

* cited by examiner

*Primary Examiner*—Wael Fahmy
*Assistant Examiner*—Dana Farahani
(74) *Attorney, Agent, or Firm*—Schmeiser, Olsen & Watts; William H. Steinberg

(57) ABSTRACT

A circuitized substrate and a method of making the circuitized substrate is provided. The circuitized substrate includes a substrate having a substantially planar upper surface and a conductive layer positioned on the substantially planar upper surface. The conductive layer includes at least one side wall therein, defining an opening in the conductive layer. The conductive layer includes an end portion spaced from the opening, the end portion forming an acute angle with the substantially planar upper surface of the substrate. The at least one side wall is substantially perpendicular to the substantially planar upper surface of the substrate.

10 Claims, 11 Drawing Sheets

FINE LINE CIRCUITIZATION

FIELD OF THE INVENTION

The invention relates generally to a circuitized substrate, and more particularly to a substrate having tightly spaced fine line circuitization positioned thereon, and method of forming same.

BACKGROUND OF THE INVENTION

Circuitized substrates, such as chip scale packages, ball grid array substrates, test carriers, multi chip modules, and printed wiring boards, often include patterns of conductors. In addition, conductive vias can be formed to electrically connect the conductors to contacts, or other patterns of conductors, located on different surfaces or internal conductive planes of the circuitized substrate.

The two approaches in the art used in mass production for forming conductors and associated connections to contacts or vias are additive circuitization using pattern plating, and subtractive circuitization following full panel plating. Typically both approaches start with a multilayer composite board or substrate that has been laminated with an external metal foil commoning layer, and which has been drilled with blind vias or through holes to make subsequent connections to internal wiring. The external metal foil, usually copper, may be thinned by chemical or mechanical means to facilitate further processing. In the typical additive circuitization process the conductor pattern is then defined by patterning a photoresist, and formed by electroplating metal into the defined pattern and drilled vias not covered by the resist. After plating, the photoresist is stripped and the original thin metal commoning layer is etched away leaving a pattern of conductors and plated vias/through holes. In the typical subtractive process, the first step after the multilayer composite board has been laminated with an external metal foil commoning layer and drilled is to blanket plate all surfaces, including drilled vias, to a final conductor thickness. The conductor pattern is then formed by patterning a photoresist on metal features to remain. All unwanted metal is removed by a chemical etching leaving a pattern of conductors and plated vias/through holes.

The additive approach to circuitization is generally capable of producing well shaped conductors with fine spacing, since the conductors are built up into channels predefined by resist. The shape and density of the conductors is limited by the ability to define channels in photoresist. However, additive methods have many challenges including uniformity of plating across the panel and inside the plated through holes, adhesion of the resist through processing steps, and problems associated with removing the thin metal commoning layer after the resist is stripped. These challenges only increase as boards become thicker and more complex. Furthermore, additive circuitization processes that use electroless plating to avoid the need for a commoning layer are very expensive, and the electroless plating baths tend to have unstable characteristics requiring close monitoring. The subtractive circuitization approach is inherently more simple, with less process steps, and is less costly. Since there is no commoning layer to remove after the conductors are formed as with additive circuitization, all problems associated with the commoning layer etch process step are avoided. In addition, very uniform plating thickness is obtained across the panel and inside plated through holes independent of board thickness. A main disadvantage of the typical subtractive process is that it is more difficult to produce substantially rectangularly shaped surface conductors of dense spacing since the process is limited by the ability to etch away surface metal, which will not normally result in the same sharp edge definition that is possible by a photopattern in resist. This disadvantage becomes more pronounced as boards become thicker and features become more dense because the process parameters required to plate inside the high aspect ratio drilled vias of thick boards will result in thicker surface plating, which in turn further limits the ability to produce dense and rectangular shaped conductors.

As circuitized substrates become denser, thicker and more complex, it is increasingly more difficult, and in many cases impossible, to use conventional processes to form the conductors. In particular, the required size, spacing and shape of the conductors most often cannot be achieved by using conventional processes, especially solely with a subtractive circuitization process.

FIG. 1 shows a much-enlarged sectional view, in elevation of a known circuitized substrate 10. The circuitized substrate 10 includes a substrate 12 having a substantially planar upper surface 14 and a plurality of conductors 16 positioned on the substantially planar upper surface of the substrate. A photoimageable photopatterned dielectric material 18 is positioned on an upper surface 20 of plurality of conductors 16.

Plurality of conductors 16 are formed using solely the conventional subtractive circuitization process described above. A conductive layer is blanket deposited on substrate 12, photopatterned with photoimageable dielectric material to expose portions of the conductive layer and then chemically etched to form plurality of conductors 16. The conductive layer includes a side wall 24 therein defining an opening 26. Chemical etching action, being substantially uniform on the exposed portions of the conductive layer, shapes side wall 24 in a curved concave manner and can form undercut regions 28, especially when the thickness of the conductive layer is greater than about 8 microns. The resultant shape in cross-section of conductors 16 is that of a half hourglass. In general, this half hourglass shape has poorer electrical performance characteristics and lower current carrying capability than substantially rectangular cross-sectional shaped conductors of the same height, width, and spacing. Furthermore, the half hourglass shape clearly limits the conductor density (number of conductors per unit area) because conductors of such shape cannot be placed as closely together as rectangular shaped conductors without creating yield (potential shorting), reliability, and electrical concerns. Conductors 16 can be acceptable when electrical performance is not important, that is, when tight spacing between the center to center dimension of the conductors is not a requirement, and when there is no need for features, such as vias, to be located between conductors. When one or all of these factors is desired, half hourglass shaped conductors are undesirable. Tight spacing between the center to center dimension of plurality of conductors 16 is difficult to achieve by chemical etching without the bases 30 of the plurality of conductors touching one another or being substantially close to touching one another creating a potential short or cross-talk between adjacent conductors.

In the industry today, these problems can be addressed by specifying the conductive layer and the resultant conductors to have a thickness of less than about 8 microns. The undercutting action of chemical etching on a conductor layer having a thickness of less than about 8 microns is of short duration with less pronounced undercutting. However, conductors having a thickness of less than about 8 microns still can have poor electrical characteristics and do have lower current carrying capability. Moreover, about 8 microns of surface copper is not a realistic limit with thick boards that include high aspect through holes that need complete plating throughout, as discussed above. When the thickness of conductors greater than about 8 microns is required in combination with tightly spaced fine lines, sufficiently more etching is required to increase the spacing between the base of the conductors. More etching increases undercutting of the conductors, makes the half hourglass shape more pronounced, and thins the distance between sidewalls of an individual conductor even further resulting in conductors having even poorer electrical performance. FIG. 2 illustrates circuitized substrate 10' after further chemical etching of circuitized substrate 10 of FIG. 1 to increase spacing between bases 30' and conductors 16'. Circuitized substrate 10' has increased spacing between bases 30' of conductors 16', however further undesirable undercutting 28' and an even more pronounced half hourglass shaped conductors exist.

The processes illustrated in FIGS. 1 and 2 are performed uniformly across an entire substrate or panel, and therefore affect every conductor and conductor sidewall in the same way. However, in circuit design for a circuit board or circuit substrate, the total length of conductor involved in areas of tight spacing is normally a small fraction of the total conductor length. For example, tight spacing may be required only on some conductor sidewalls within a fine pitch ball grid array (BGA) site of a printed wiring board, or on the inside sidewalls of two adjacent coupled-pair conductors, but not required on the majority of surface conductors. The process resulting in the structure illustrated in FIG. 1 would be adequate for the vast majority of conductor sidewalls, even though not acceptable in the limited areas of tight spacing. Similarly, the additional etch process, necessary to product tight spacing on only a portion of a circuitized substrate, resulting in the structure illustrated in FIG. 2 would also adversely affect all conductor sidewalls, even where tight spacing was not required. The ideal solution is a process that can differentiate areas of tight spacings from those which can be processed with conventional subtractive circuitization methods.

Accordingly, there is a need in the art for improved processes for fabricating tightly spaced finer patterns of conductors to make a circuitized substrate by utilizing a partial subtractive etching process in the area of the circuitized substrate, where these finer patterns of conductors are desired, which overcomes the disadvantages of the known method and structure.

OBJECTS AND SUMMARY OF THE INVENTION

Accordingly, it is the object of this invention to enhance the art of electronic packaging.

Another object of the present invention is to provide a circuitized substrate including a conductive layer having an opening therein, the conductive layer positioned on a substantially planar upper surface of the circuitized substrate, at least one side wall of the opening being substantially perpendicular to the substantially planar upper surface of the substrate, and the conductive layer including an end portion spaced from the opening forming an acute angle with the substantially planar upper surface of the substrate.

Yet another object of the present invention is to provide a method of making a circuitized substrate having a substrate with an upper surface and a conductive layer on the upper surface of the substrate, the conductive layer including a side wall and a bottom wall, the bottom wall defined by the upper surface of the substrate, the side wall being substantially perpendicular with the bottom wall.

Another object of the present invention is to provide a circuitized substrate and method of making the circuitized substrate that includes at least one tightly spaced fine pattern of conductors thereon and assures electrical performance.

According to one aspect of the invention, there is provided a circuitized substrate comprising a substrate having a substantially planar upper surface, a conductive layer positioned on the substantially planar upper surface including at least one side wall therein defining an opening in the conductive layer, the conductive layer including an end portion spaced from the opening, the end portion forming an acute angle with the substantially planar upper surface of the substrate, the at least one side wall being substantially perpendicular to the substantially planar upper surface of the substrate.

According to another aspect of the invention, there is provided a method of making a circuitized substrate comprising the steps of providing a substrate having an upper surface, positioning a conductive layer having a substantially planar upper surface on the upper surface of the substrate, positioning a layer of patternable material on the substantially planar upper surface of the conductive layer, removing a portion of the layer of patternable material to form a side wall in the patternable layer and to expose a predetermined pattern on the substantially planar upper surface of the conductive layer, the side wall in the layer of patternable material being substantially perpendicular to the substantially planar upper surface of the conductive layer, removing a portion of the conductive layer under the predetermined pattern to form an interim side wall in the conductive layer, and removing portions of the interim side wall in the conductive layer to form a second side wall and a bottom wall, the bottom wall defined by the upper surface of the substrate, the second side wall being substantially perpendicular with the bottom wall.

According to yet another aspect of the invention, there is provided a method of making a circuitized substrate comprising the steps of providing a substrate having an upper surface, positioning a conductive layer having a substantially planar upper surface on the upper surface of the substrate, removing a portion of the conductive layer to form a interim side wall in the conductive layer, positioning a layer of patternable material on the substantially planar upper surface of the conductive layer and on the interim side wall in the conductive layer, removing a portion of the layer of patternable material on the conductive layer to expose the interim side wall in the conductive layer and a portion of the substantially planar upper surface of the conductive layer relative to the interim side wall to form a side wall in the layer of patternable material, the side wall in the layer of patternable material being substantially perpendicular to the substantially planar upper surface of the conductive layer, and removing portions of the interim side wall in the conductive layer to form a second side wall and a bottom wall, the bottom wall defined by the upper surface of the substrate, the second side wall being substantially perpendicular with the bottom wall.

The above objects, advantages, and features of the present invention will become more readily apparent from the following detailed description of the preferred embodiments as illustrated in the accompanying drawings.

BEST MODE FOR CARRYING OUT THE INVENTION

Figure 1:
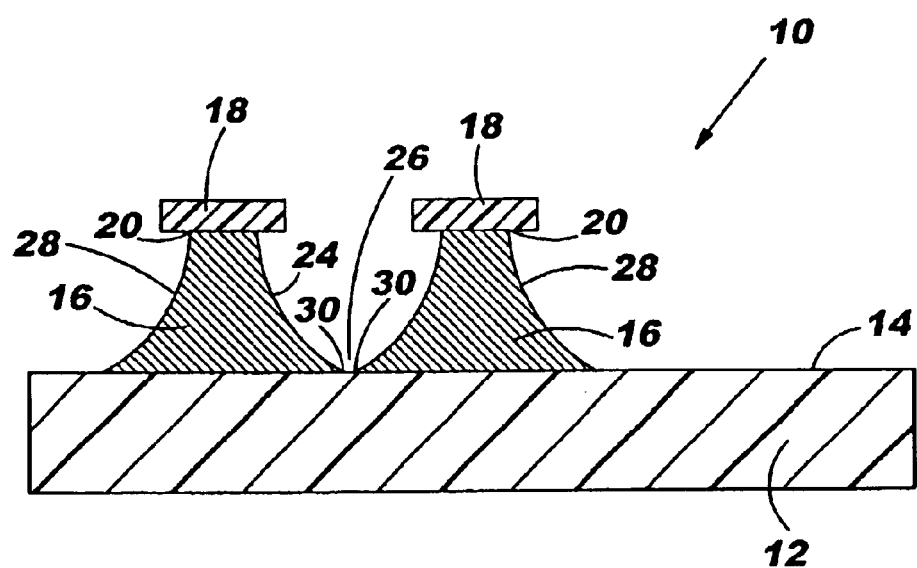
FIG. 1 represents a much-enlarged sectional view in elevation of a known circuitized substrate having conductors formed from a chemically etched conductive layer.
Figure 2:
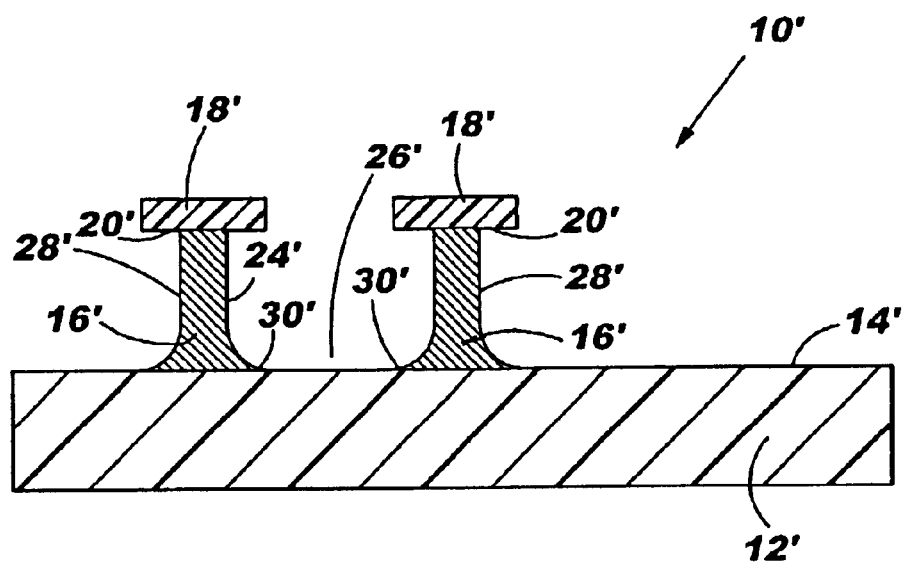
FIG. 2 represents the known circuitized substrate of FIG. 1, with the conductive layer shown as being further chemically etched.
Figure 3:
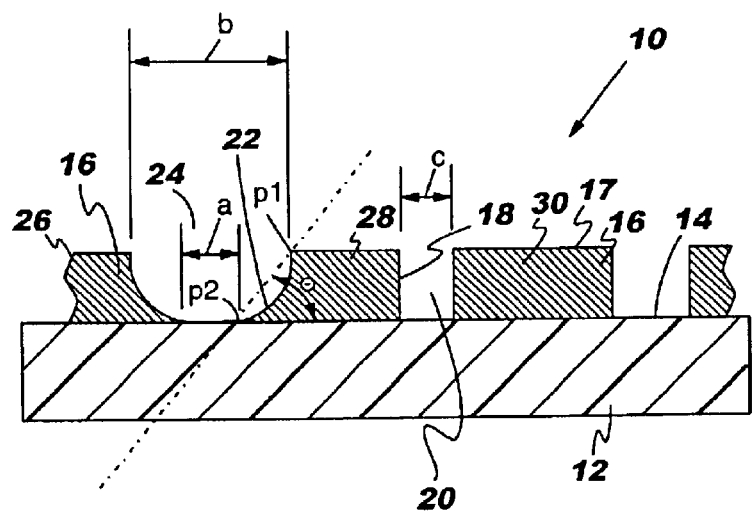
FIG. 3 represents a much-enlarged sectional view in elevation of one embodiment of the circuitized substrate of the present invention.

A circuitized substrate 10 illustrating one embodiment of the present invention is shown in FIG. 3. The circuitized substrate includes a substrate 12 having a substantially planar upper surface 14. A conductive layer 16 is positioned on substantially planar upper surface 14. Conductive layer 16 includes an upper surface 17 and at least one side wall 18 therein, defining an opening 20 in the conductive layer. The conductive layer 16 includes an end portion 22 spaced from opening 20, the end portion forming an acute angle θ with substantially planar upper surface 14 of substrate 12. Acute angle θ is defined as the angle between substantially planar upper surface 14 of substrate 12 and the intersection of a line drawn between points p1 and p2 of end portion 22. The acute angle θ can vary, depending on processing conditions and conductor layer thickness, from about 60 degrees to about 80 degrees. The at least one side wall 18 is substantially perpendicular to substantially planar upper surface 14 of substrate 12. Substantially perpendicular is defined as an angle of greater than about 80 degrees to about 90 degrees.

Substrate 12 can comprise a chip carrier, printed wiring board, or any suitable substrate on which a conductor layer is to be positioned for electrical interconnect purposes. Examples of suitable substrates that can be used in this invention may be comprised of epoxy resins filled with glass, ceramics, silicon, polyimide, and polytetrafluoroethylene. Conductive layer 16 can be electrically connected to conductive through apertures (not shown) within substrate 12 to make electrical connections to other electronic devices. Conductive layer 16 comprises a metal selected from the group of metals consisting of copper, aluminum, tin, gold, nickel, titanium, tungsten, and hafnium and alloys thereof. Conductor layer 16 can also comprise a semiconductor such as silicon, polysilicon, germanium, or gallium arsenide.

End portion 22 of conductive layer 16 can, at least in part, include a curvilinear surface. The curvilinear surface can be substantially concave and can be formed by chemical etching of conductive layer 16. End portion 22 of conductive layer 16 defines a second opening 24 in the conductive layer. Second opening 24 separates conductors 26 and 28 by a width a. In order to separate conductors 26 and 28 by width a using chemical etching, conductive layer 16 must be etched so that the width between conductors 26 and 28, as measured at upper surface 17 of conductive layer 16, is dimension b. Second opening 24 between conductors 26 and 28 can have minimum width a in a range between about 25 microns to about 300 microns with dimension b being between about 50 microns and about 400 microns. When opening 20, having a dimensions c of less than about 125 microns with a substantially rectangular shape is desired in conductive layer 16 and the conductive layer has a thickness of more than about 8 microns, sidewall 18 is formed by laser etching followed by chemically etching, as described in detail below. A chemically etched opening having a substantially rectangular shape with dimension c is not possible when the conductor is greater than about 8 microns, because a chemically etched opening would have a bowl shape similar to second opening 24. For example, if minimum width a between conductors 26 and 28 is specified to be equal to dimension c, FIG. 3 illustrates that, if chemical etching is used alone to form opening 20, it would be necessary to chemically etch the opening to dimension b to achieve spacing c. Conductors 28 and 30 would be spaced farther apart and would have curvilinear sidewalls and degraded performance when compared to rectangular shaped and more closely spaced conductors.

The advantage of this structure is that it enables a circuitized substrate designer and the manufacturer of the circuitized substrate the flexibility of designing and manufacturing a circuitized substrate having both tightly spaced conductors, spaced less than about 125 microns apart and, conventionally spaced conductors on the same circuitized substrate when the conductors are about 8 microns thick or more. Importantly, when tightly spaced fine line conductors are necessary for electrical performance of a circuitized substrate or it is necessary to place features, such as vias or pads, between tightly spaced conductor portions on a circuitized substrate, the laser etching (or scribing, drilling or machining) and chemical etching methods, described in detail below, can be utilized to yield substantially rectangular conductor portions with substantially vertical side walls. Where improved electrical performance characteristics or higher conductor density, resulting from tight spacing with substantially rectangular shaped conductors, are not as important on certain other areas of the circuitized substrate, a conventional chemical etching process to make conductors on that area of the same circuitized substrate can be used.

Figure 4:
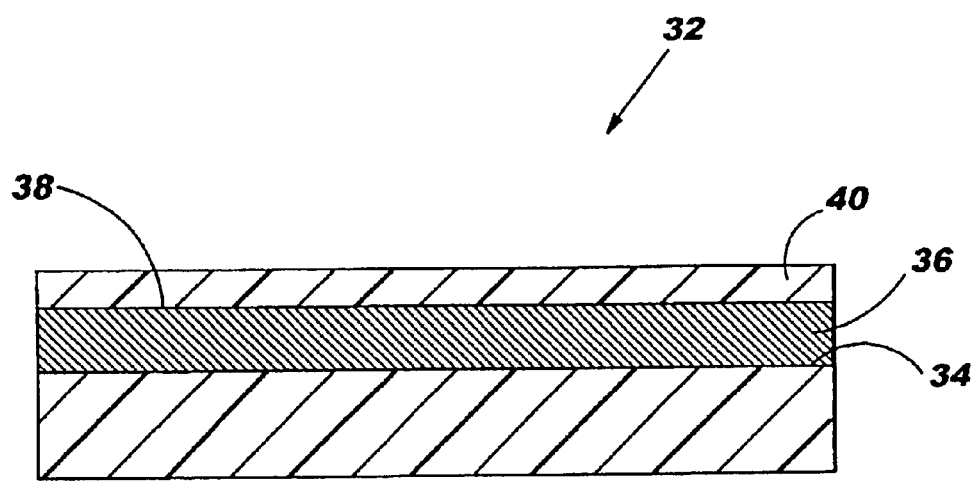
FIGS. 4–7 represent the various steps of making a circuitized substrate in accordance with one embodiment of the invention.

In FIG. 4, there is shown a substrate 32 which may be used in one embodiment of the present invention to produce a circuitized substrate (shown in FIG. 7 and described herein below). Substrate 32 includes an upper surface 34 and has been previously described in detail above. Positioned on upper surface 34 of substrate 32 is a conductive layer 36. Conductive layer 36 can be positioned on upper surface 34 of substrate 32 to a thickness of from about 8 microns to about 150 microns by a process of laminating, plating, evaporating, sputtering or combinations thereof. The conductive layer has been previously described in detail above. Positioned on a substantially planar upper surface 38 of conductive layer 36 is a layer of patternable material 40. The layer of patternable material 40 can be an acrylic or an epoxy acrylic photosensitive or photopolymerizable material such as a photoresist or a soldermask and can be a positive or a negative acting. Positive acting photoresists, when applied and exposed through a suitable photomask, undergo a physical and chemical change in the exposed areas that renders these exposed areas soluble to subsequent developer solution which is to be applied thereto. Negative acting photoresists, when applied and exposed through a suitable photomask, undergo a physical and chemical change in the exposed areas that renders these exposed areas insoluble to subsequent developer solution which is to be applied thereto. An electrodeposited positive acting resist can also be used with this invention. The patternable material can be applied by a process of spraying, laminating, spin-coating, screening, curtain coating, and dipping or in the case of an electrodeposited resist, by electroplating. The thickness of patternable material 40 can range from about 6 microns to about 75 microns. Some examples of suitable commercially available patternable materials are Riston available from E. I. du Pont de Nemours and Company, Wilmington, Del., Dynavia Series and PEPR Series, both available from Shipley Ronal, 2675 Antler Drive, Carson City, Nev. 89701, and PSR Series, available from Taiyo America, 455 Forest St., Marborough, Mass. 01752.

Figure 5:
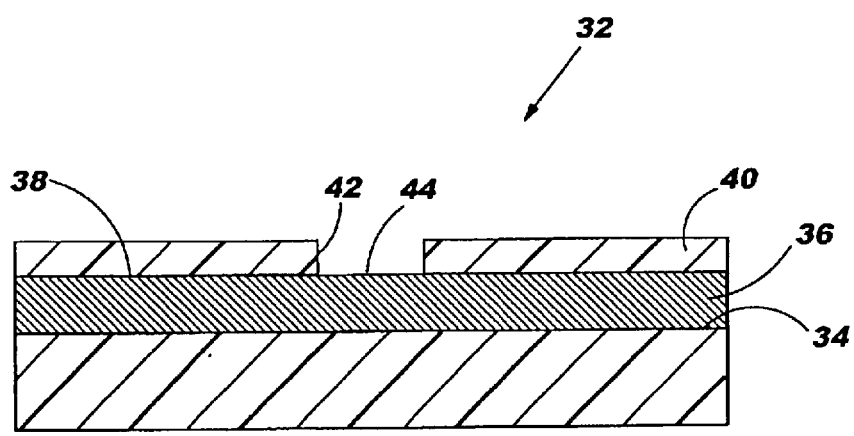

In FIG. 5, portions of layer of patternable material 40 of substrate 32 are shown as being removed to form a sidewall 42 in the layer of patternable material and to expose a predetermined pattern 44 on substantially planar upper surface 38 of conductive layer 36 to which further processing is to eventually occur. Predetermined pattern 44 can be formed by a process of exposing a pattern in a negative acting photoresist to UV light and removing the unexposed portions of the patterned photoresist with a developing solution (e.g., sodium carbonate or propylene carbonate). Predetermined pattern 44 can also be formed by the action of a laser, such as a $CO_2$ or YAG laser on the portions of the layer of patternable material to be removed. Side wall 42 in layer of patternable material 40 is shown as being substantially perpendicular to substantially planar upper surface 38 of conductive layer 36. In the present invention, side wall 42 is not limited to being formed perpendicular to substantially planar upper surface 38 and can be formed having an acute angle with the planar upper surface of conductive layer 36.

Figure 6:
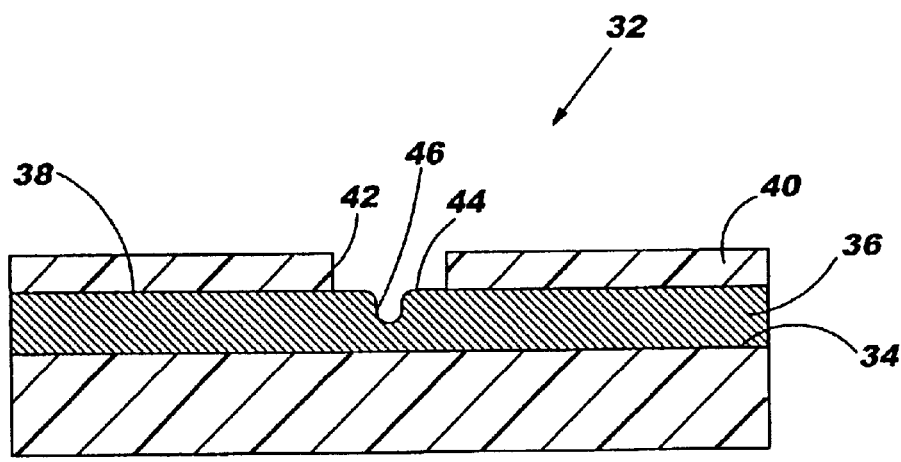

In FIG. 6, a portion of substantially planar upper surface 38 of conductive layer 36 within predetermined pattern 44 of substrate 32 is shown after being subjected to a laser etching process to remove the portion of the conductive layer under the predetermined pattern forming an interim sidewall 46 in the conductive layer. Interim side wall 46 is formed in conductive layer 36 to a depth of from about 50% to about 95% of the thickness of the conductive layer. The interim side wall 46 is formed having a minimum thickness (remaining conductor material) of from about 5% to about 50% of the thickness of conductive layer 36. In one example, laser etching was performed with an ESI 5200 Laser Microvia System. A frequency-tripled Nd:YAG laser, operating at a wavelength of from about 150 nanometers (nm) to about 600 nm with a pulse width of from about 20 nanoseconds (ns) to about 150 ns, was used. Pulse width of a YAG laser is defined as the length of time for which the energy of a given laser pulse is greater than or equal to $1/e^2$ the maximum energy for that pulse. The laser etching process includes the steps of focusing the YAG laser beam to a diameter of from about 6 microns to about 300 microns at a power of from about 0.5 watts to about 15 watts on the portion of conductive layer 36 under predetermined pattern 44. The spatial distribution of energy in the laser spot can be gaussian, greatest at the center of the spot, diminishing toward the perimeter. Laser etching at these parameters removes portions of conductive layer 36 under predetermined pattern 44 in about 6 micron to about 150 micron bites at a repetition rate of from about 10 hertz to about 50 kilohertz. Bite size is defined as center to center distance between laser pulses and the repetition rate is defined as the number of laser pulses delivered to portions of conductive layer 36 per unit time. Although a YAG laser is described to form interim side wall 46, it is understood that the invention is not limited thereto. Other lasers for example, Nd:YLF, Argon Ion, and Xenon can be used to form interim side wall 46. Other techniques, for example, focused ion beam, can also be used to form interim side wall 46.

Figure 7:
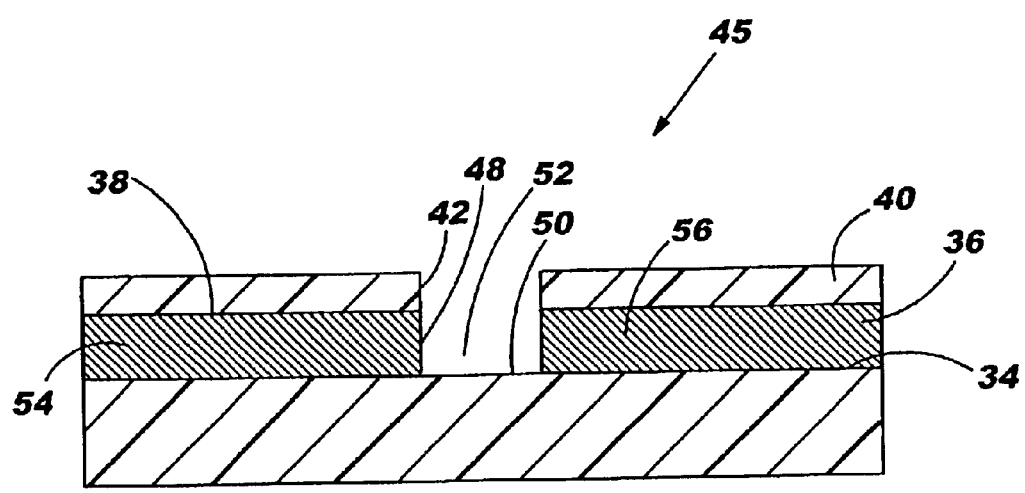

In FIG. 7, circuitized substrate 45 is shown after portions of the interim side wall 46 in conductive layer 36 of substrate 32 (see FIG. 6) have been subjected to wet chemical etching. In a preferred embodiment of the invention, portions of interim side wall 46 have been removed by a wet chemical etching process to form a second side wall 48 and a bottom wall 50, the bottom wall defined by upper surface 34 of substrate 32, the second side wall being substantially perpendicular with bottom wall 50. The wet etching process can be accomplished with a solution consisting essentially of cupric chloride, sulfuric acid, ferric chloride, sodium persulfate, or potassium persulfate at a temperature of from about 120° F. to about 140° F. for about 2 minutes to about 20 minutes (depending on the concentration of the etching solution). Second side wall 48 and bottom wall 50 define an opening 52 having a width of less than about 125 microns, as described above, which is a space in cross-section that separates portions of conductive layer 36 into conductors 54 and 56. At this point it may be desirable to remove layer of patternable material 40. It is understood that opening 52 is shown for illustration purposes only and does not limit the invention to those as shown.

Figure 8:
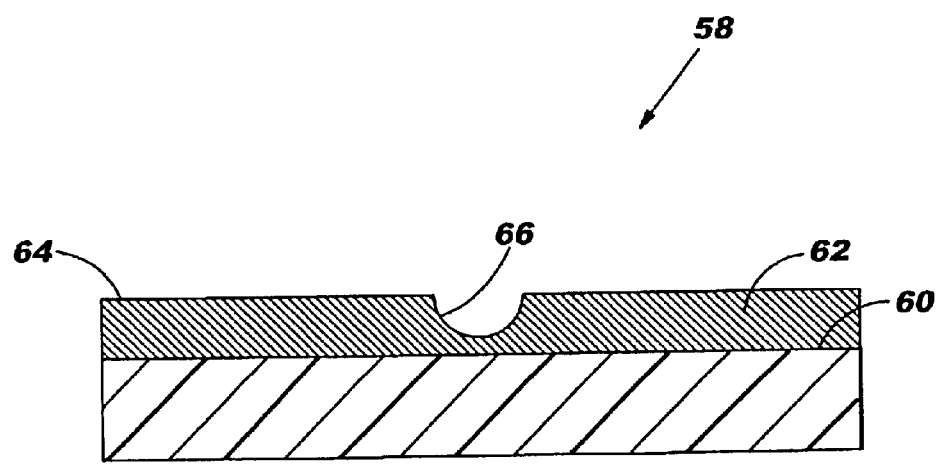
FIGS. 8–11 represent the various steps of making a circuitized substrate in accordance with another embodiment of the invention.

In FIG. 8, there is shown a substrate 58 which may be used in another embodiment of the present invention to produce a circuitized substrate (shown in FIG. 11 and described herein below). Substrate 58 includes an upper surface 60 and has been described in detail above. Positioned on upper surface 60 is a conductive layer 62 having a substantially planar surface 64. The conductive layer 62 and the process for positioning the conductive layer on upper surface 60 have been previously described above. A portion of substantially planar upper surface 64 of conductive layer 62 is shown as being removed forming an interim side wall 66 in the conductive layer. Interim side wall 66 can be formed with, but is not limited to, the laser and laser etching process used to form interim side wall 46 in conductive layer 36, as previously described in detail above, and can have a minimum thickness (remaining conductor material) of from about 5% to about 50% of the thickness of conductive layer 62. Substantially planar upper surface 64 may need cleaning to remove remnants of conductive layer 62 after laser etching, which may have been redeposited on substantially planar upper surface during the laser etching process. The cleaning process can consist of immersion of substrate 58, or spraying substantially planar upper surface 64, with a mild etching solution that slowly removes a small amount of conductive layer 62 undercutting any debris that may be present, and thereby lifting it from the surface.

Figure 9:
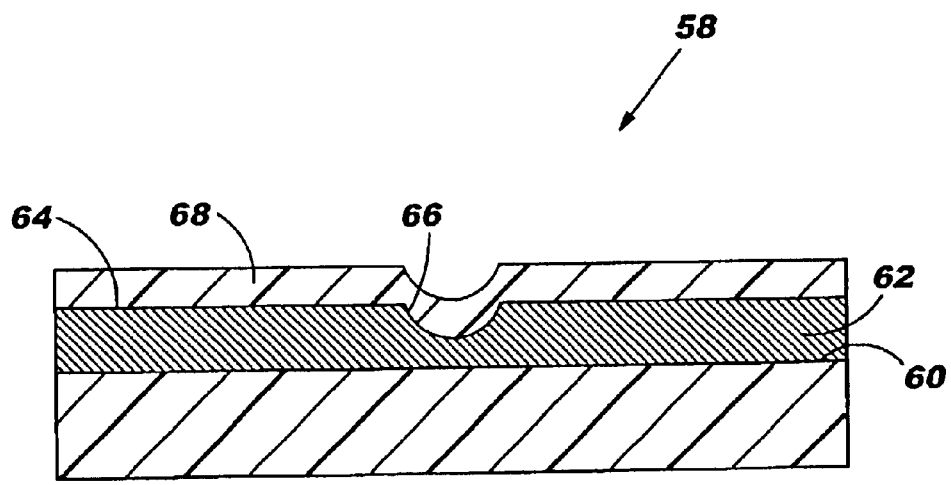

In FIG. 9, a layer of patternable material 68 is shown as being positioned on substantially planar upper surface 64 of conductive layer 62 and on interim side wall 66 in the conductive layer. The layer of patternable material 68 and the process to position the layer of patternable material on substantially planar upper surface 64 and on interim side wall 66 can comprise the same material and process as described in detail above regarding layer of patternable material 40.

Figure 10:
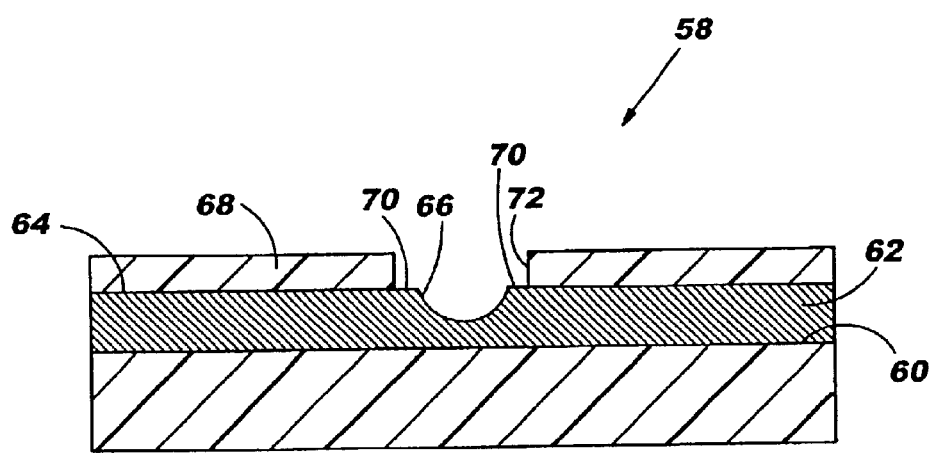

In FIG. 10, a portion of layer of patternable material 68 on conductive layer 62 is shown as being removed to expose interim side wall 66 in the conductive layer and to expose a portion 70 of substantially planar upper surface 64 of the conductive layer relative to the interim side wall. A side wall 72 is formed in layer of patternable material 68, the side wall being shown as being substantially perpendicular to planar upper surface 64 of conductive layer 62. In the present invention, side wall 72 is not limited to being formed perpendicular to planar upper surface 64 and can be formed having an acute angle with the planar upper surface of conductive layer 62.

Figure 11:
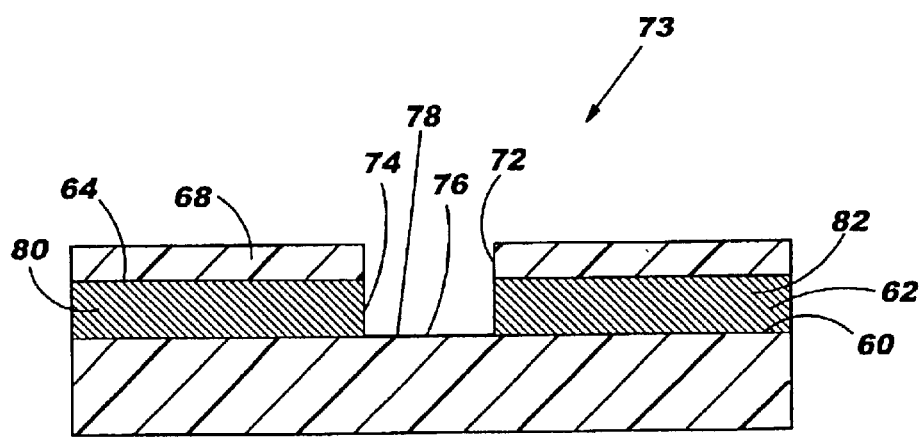

In FIG. 11, circuitized substrate 73 is shown with a second side wall 74 and a bottom wall 76 defined by upper surface 64 of the substrate. The second side wall 74 is formed by removing portions of interim side wall 66, and portion 70 of substantially planar upper surface 64 of conductive layer 62 (shown in FIG. 10). The step of removing portions of interim side wall 66 and portion 70 of substantially planar upper surface 64 comprises chemical etching, as previously described above. Second side wall 74 is shown as being substantially perpendicular with bottom wall 76. Sidewall 74 and bottom wall 76 define an opening 78 having a width less than about 125 microns which is a space in cross-section which separates conductors 80 and 82. At this point it may be desirable to remove layer of patternable material 68.

Thus there have been shown and described three facile methods for producing a circuitized substrate which are capable of being readily performed using many established processes in the art. The invention thus represents a relatively inexpensive yet effective process for producing high electrical performance circuitized substrates on a mass scale having tightly spaced fine lines. As stated above, it is also readily possible to utilize alternative procedures which are also known in the art, to accomplish this invention.

While there have been shown and described what are at present considered the preferred embodiments of the invention, it will be obvious to those skilled in the art that various changes and modifications may be made therein without departing from the scope of the invention as defined by the appended claims.

We claim:

1. A circuitized substrate comprising:
   a substrate having a substantially planar upper surface;
   a conductive layer positioned on the upper surface including of the substrate, said conductive layer including a bottom surface that is in direct mechanical contact with the upper surface of the substrate, said conductive layer including a top surface above and separated from the upper surface of said substrate, said conductive layer including a first opening extending from the top surface of the conductive layer to the bottom surface of the conductive layer, said conductive layer including a first conductive segment, said first conductive segment having a first end surface and second end surface, said first end surface coinciding with a side wall of the first opening, said side wall being substantially perpendicular to the upper surface of the substrate, said second end surface comprising a first point on the bottom surface of the conductive layer and a second point on the top surface of the conductive layer, said first point being direct mechanical contact with the upper surface of the substrate, wherein a straight line through the first point and the second point forms an acute angle with the upper surface of the substrate.

2. The circuitized substrate of claim 1, wherein the second end surface is curvilinear.

3. The circuitized substrate of claim 2, wherein said curvilinear second end surface is substantially concave such that a void region exists between the second end surface and the straight line.

4. The circuitized substrate of claim 1, wherein said the first opening in said the conductive layer has a width or less than about 125 microns.

5. The circuitized substrate of claim 1, wherein the conductive layer further includes a second conductive segment separated from the first conductive segment by a first width of separation at the bottom surface of the conductive layer and by a second width of separation at the top surface of the conductive layer.

6. The circuitized substrate of claim 5, wherein the second width of separation exceeds the first width of separation.

7. The circuitized substrate of claim 6, wherein the first width of separation is in a range between about 25 microns and about 300 microns, and wherein the second width of separation is in a range between about 50 microns and about 400 microns.

8. The circuitized substrate of claim 5, wherein the conductive layer has a second opening between the first and second conductive segments, and wherein the second opening is bowl shaped.

9. The circuitized substrate of claim 5, wherein the first conductive layer has a thickness exceeding about 8 microns.

10. The circuitized substrate of claim 1, wherein the first opening has a substantially rectangular shape.

* * * * *